United States Patent

Demsky et al.

[15] 3,650,854

[45] Mar. 21, 1972

[54] METHOD OF FABRICATING A TRANSISTOR HAVING IMPROVED EMITTER-BASE JUNCTION BREAKDOWN VOLTAGE CHARACTERISTICS

[72] Inventors: Herbert M. Demsky, Wappingers Falls; Alan Platt, La Grangeville, both of N.Y.; Arthur J. Rideout, Wettswil, Switzerland; Robert S. Samson, Fishkill, N.Y.

[73] Assignee: International Business Machines Corporation, Armonk, N.Y.

[22] Filed: Aug. 3, 1970

[21] Appl. No.: 60,467

[52] U.S. Cl...............................148/187, 148/188, 148/190, 317/235 X, 317/235 AN

[51] Int. Cl...............................H01l 7/44

[58] Field of Search..............................148/187, 188, 189, 190, 191; 317/235 X, 235 AN

[56] References Cited

UNITED STATES PATENTS

| | | | |
|---|---|---|---|
| 2,868,678 | 1/1959 | Shockley | 148/189 |
| 2,975,080 | 3/1961 | Armstrong | 148/188 |
| 3,085,033 | 4/1963 | Handelman | 148/191 |
| 3,155,551 | 9/1964 | Bennett | 148/191 |
| 3,193,419 | 7/1965 | White | 148/191 |
| 3,303,069 | 2/1967 | Tokuyama et al. | 148/187 |
| 3,303,070 | 2/1967 | Schmidt et al. | 148/190 X |
| 3,354,008 | 11/1967 | Brixey et al. | 148/187 |
| 3,364,085 | 1/1968 | Dahlberg | 148/187 |
| 3,402,081 | 9/1968 | Lehman | 148/188 |
| 3,436,809 | 4/1969 | Peacock | 148/187 X |

*Primary Examiner*—Tobias E. Levow
*Assistant Examiner*—J. Cooper
*Attorney*—Hanifin and Jancin and Wolmar J. Stoffel

[57] ABSTRACT

A process for producing in a transistor a slumped base profile wherein the base diffusion window is reoxidized, a layer of $P_2O_5$ is deposited over the oxide, an insulating layer deposited over the $P_2O_5$, an emitter window opened, and emitter diffusion made.

7 Claims, 5 Drawing Figures

INVENTORS
HERBERT M. DEMSKY
ALAN PLATT
ARTHUR J. RIDEOUT
ROBERT S. SAMSON

BY Wolmar J. Stoffel
ATTORNEY

METHOD OF FABRICATING A TRANSISTOR HAVING IMPROVED EMITTER-BASE JUNCTION BREAKDOWN VOLTAGE CHARACTERISTICS

BACKGROUND OF THE INVENTION

1. Field of the Invention

This invention relates to transistors, particularly but not exclusively to high frequency, high performance transistors of the planar type which embody relatively high impurity concentrations in the base and emitter regions thereof.

2. Description of the Prior Art

High performance transistors, particularly transistors utilized in computer applications, require a high frequency response combined with reasonable gain. In order to obtain these operating characteristics, it is well established that the transistors structure have, among other characteristics, a narrow base width and a low base resistance. In order to obtain a low base resistance, the amount of dopant within the active base regions must be relatively high.

In the fabrication of planar type transistors, the surface of a wafer is masked leaving an opening in the mask to diffuse an impurity into the wafer. The base is first formed by this technique followed by a reforming of the mask and making a second diffusion into the original base region to form the emitter. In making such diffusions from the surface of the wafer the impurity doping is highest at the surface of the wafer and decreases in concentration with depth in the wafer. Thus to obtain a suitable base concentration in the area below the emitter, the surface concentration is significantly higher than the active base region which should preferably be of the order of $10^{19}$ atoms per c.c. In order to form the emitter region, sufficient impurity is required to first compensate for the impurity introduced during the formation of the base region and secondly to introduce additional material to form an opposite redoped type region which constitutes the emitter. This normally results in surface concentrations of the emitter to be on the order two magnitudes higher than the base region. This inherently results in a high impurity gradient across the PN junction at the surface of the wafer. With high impurity gradients across the PN junction there is the danger that the emitter base junction will breakdown under the voltages intended to be used to operate the device. It also introduces the possibility that there will be a leakage across the emitter base junction. When a great number of such devices are used in certain applications, as for example the memory of a computer, the combined leakage currents may well exceed the current level intended to operate the memory. This may make the overall device inoperable.

SUMMARY OF THE INVENTION

An object of this invention is to provide a method to improve the emitter-base junction breakdown voltage in a transistor.

Another object of this invention is to provide a transistor having improved emitter base breakdown voltage characteristics.

Another object of this invention is to provide a method for reducing the impurity gradient across the emitter base junction adjacent to surface of a transistor. Yet another object of this invention is to provide a method for reducing the impurity gradient across a PN junction adjacent the surface of the device.

These and other objects are accomplished by the method of the invention wherein the process for fabricating a planar type semiconductor device includes a step of diffusing from the surface a first region, forming a first thin insulating layer over the first region, forming a layer of dopant material, preferably $P_2O_5$, over the first layer of material, covering the dopant layer with a second insulating layer, defining a second diffusion window overlying, at least in part, the first diffused region through the dopant layer, and making a second diffusion of an opposite impurity type. In making the second diffusion the impurity material in the dopant layer, which is opposite the type of material of the first region, diffuses downwardly through the first layer to compensate the first region and therefore produce a slumped impurity profile at the surface.

BRIEF DESCRIPTIONS OF THE DRAWINGS

The foregoing and other objects, features and advantages of the invention will be apparent from the following, more particular description of the preferred embodiments of the invention to illustrate it in the accompanied drawings, wherein.

DESCRIPTION OF PREFERRED EMBODIMENTS

Figure 1:
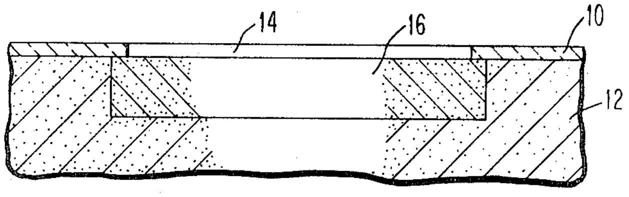
FIGS. 1 through 3 are cross-sectional views in broken sections of a semiconductor member in various stages which illustrates the method of the invention.
Figure 2:
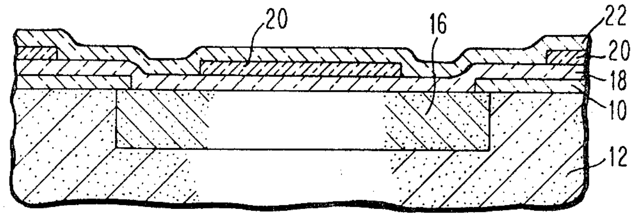
Figure 3:
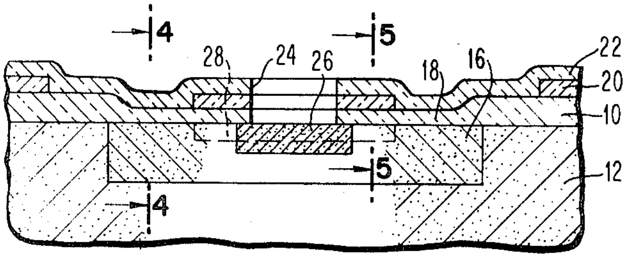

Referring now to the drawings, FIGS. 1 through 3 in particular, there is illustrated a sequence of steps for producing the slumped emitter-base profile in a transistor. As illustrated in FIG. 1 a masking layer 10 typically $SiO_2$ is formed on the surface of wafer 12 and a window 14 formed therein by conventional photolithographic techniques. It is understood that only a portion of wafer 12 is illustrated. The wafer could include burried subcollectors, isolation regions, and other features common to semiconductor technology. A diffusion is then made through window 14 which results in a base region 16 of a first type impurity of an opposite type then in wafer 12. Typically wafer 12 has a background N type impurity and region 16 has embodied therein a P type impurity such as boron. Typically the surface concentration of region 16 after the diffusion has been completed may have an impurity concentration on the order of $10^{20}$ atoms per c.c. This relatively high surface concentration is necessary in order to introduce impurity in a sufficient concentration adjacent the bottom of region 16 which will ultimately be the actual working area of the base.

As shown in FIG. 2, an $SiO_2$ layer 18 is grown over the surface of wafer 12 closing the diffusion window 14. This layer can conveniently be grown by exposing the wafer to an oxidizing heated environment such as steam heated to a temperature in the range of 900° to 1,150° C., or stated another way, a temperature on the order of 950° C. The thickness of layer 18 will be in the range of 300 to 700 angstroms, most preferably 500 angstroms for the reason which will be explained hereinafter. Thereafter, layer 20 of $P_2O_5$ is deposited over the entire surface of wafer 12, and portions preferably delineated by photolithographic techniques. The $P_2O_5$ layer 20 is retained over region 14 and shaped so that it will overly the emitter region and extend beyond the outer periphery. Layer 20 can be relatively thin, normally on the order of 50 to 100 angstroms and is preferably enriched with P atoms. Thereafter, a covering insulating layer 22 is deposited over the surface of the wafer and at least over the portion of layer 20 overlying the ultimate emitter region. Layer 22 can be of any suitable covering layer such as $SiO_2$ or the like. Most preferably layer 22 consists of an $Si_3N_4$ layer which can be grown pyrolytically or deposited by sputtering techniques.

Figure 4:
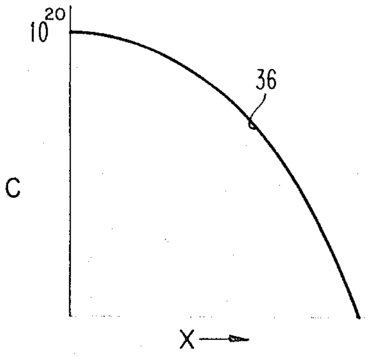
FIG. 4 is an impurity profile graph.
Figure 5:
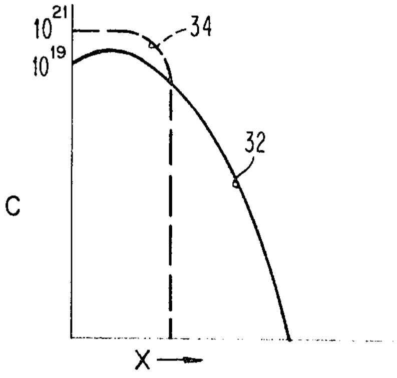
FIG. 5 is an impurity profile graph taken on section 5—5 of FIG. 3 which illustrates the slumped impurity profile produced by the method of the invention.

As shown in FIG. 3 diffusion window 24 is formed in layers 10, 20, and 22 and a diffusion made therethrough resulting in emitter region 26. Preferably region 26 is an N type region formed by diffusion arsenic through window 24 which can be conveniently accomplished by a capsule diffusion. The surface concentration of region 26 will be on the order of $10^{21}$ atoms per cc. For purposes of illustration the layers 10 and 18 have been shown in FIG. 3 as a single layer since both are preferably formed of $SiO_2$ and therefore there is no significant line of demarcation therebetween. During the emitter diffusion resulting in emitter region 26 phosphorus dopant atoms contained in layer 22 diffuse through the relatively thin layer 18 and penetrate the wafer 12 at the surface region of the emitter base junction. This is illustrated by region 28 illustrated in dotted lines in FIG. 3. In the base region phosphorus atoms being N type compensate the electrical effect of the P type impurity atoms in base region 16. This reduces the impurity gradient across the emitter base junction as more clearly illustrated in FIG. 5. FIG. 5 is an impurity profile taken on line 5—5 wherein profile 32 indicates the impurity concentration with depth. As indicated the concentration at the surface is significantly lower than the concentration at a point spaced downwardly from the surface. This can be characterized as a slumped profile. For purposes of illustration, curve 34 depicts the profile of the emitter region 26. Profile 34 would not appear on line 5—5 but was included for purposes of illustration. FIG. 4 is a profile taken on line 4—4 of FIG. 3 and depicts the base profile in a region which has thus been compensated. Curve 36 is a conventional Guassian distribution wherein the impurity concentration is greatest at the surface of the device.

Layer 20 thus serves to introduce impurity atoms in the region of the emitter base junction which reduces the impurity gradient across the junction and also serves as a gettering layer absorbing various impurities in layer 18 such as $Na^+$ ions etc. The thickness of layer 18 which is disposed between the $P_2O_5$ layer 20 and region 14 of device 12 is preferably of a thickness on the order of 500 angstroms. However, the layer can be thicker or thinner depending on the enrichment of phosphorus in $P_2O_5$ layer 20. If the layer 20 is significantly enriched, layer 18 can be thicker. The structure as shown in FIG. 3 is completed by fastening terminals to the various regions which structure is not shown because it is not part of the invention.

While the invention has been particularly shown and described with reference to preferred embodiments thereof, it will be understood by those skilled in the art that the foregoing and other changes in form and detail may be made without departing from the spirit or scope of the invention.

What is claimed is:

1. A process for producing in a semiconductor device a slumped base profile comprising,
- introducing into a semiconductor body, a first type impurity producing a first region,
- forming a first insulating layer of oxide over the surface of the body,
- forming a layer of dopant of an opposite type impurity to the impurity in said first region over said first insulating layer which at least overlies a portion of the first region,
- depositing a second insulating layer over said dopant layer,
- forming a diffusion window over said first diffused region through said first insulating layer, said dopant layer, and said second insulating layer, said diffusion window being within the area of said dopant layer
- diffusing an impurity of an opposite type to the impurity in said first region through said diffusion window producing a diffused region of an opposite type impurity,
- and during said diffusion also diffusing impurities from said dopant layer through said first insulating layer to compensate the impurity in said first region at the surface of the device.

2. The process of claim 1 wherein said dopant layer is a layer of $P_2O_5$.

3. The process of claim 2 wherein said first insulating layer has a thickness in the range of 300 to 700 A.

4. The process of claim 3 wherein said first insulating layer has a thickness on the order of 500 A.

5. The process of claim 3 wherein said first insulating layer is a layer of $SiO_2$.

6. The process of claim 3 wherein said second insulating layer is a layer of $Si_3N_4$.

7. The process of claim 3 wherein said second insulating layer is a layer of $SiO_2$.

* * * * *